United States Patent
Kuo et al.

(10) Patent No.: US 9,310,857 B2
(45) Date of Patent: Apr. 12, 2016

(54) AIR GUIDE UNIT

(71) Applicant: Celestica Technology Consultancy (Shanghai) Co., Ltd., Shanghai (CN)

(72) Inventors: Che Yu Kuo, New Taipei (TW); Jin Cai Shan, Shanghai (CN)

(73) Assignee: CELESTICA TECHNOLOGY CONSULTANCY (SHANGHAI) CO., LTD., Shanghai (CN)

( * ) Notice: Subject to any disclaimer, the term of this patent is extended or adjusted under 35 U.S.C. 154(b) by 404 days.

(21) Appl. No.: 13/907,352

(22) Filed: May 31, 2013

(65) Prior Publication Data

US 2014/0204527 A1   Jul. 24, 2014

(30) Foreign Application Priority Data

Jan. 23, 2013   (CN) .......................... 2013 1 0025256

(51) Int. Cl.
*H05K 7/20* (2006.01)
*G06F 1/20* (2006.01)

(52) U.S. Cl.
CPC .............. *G06F 1/20* (2013.01); *H05K 7/20145* (2013.01); *H05K 7/20554* (2013.01); *H05K 7/20572* (2013.01)

(58) Field of Classification Search
CPC .......... H05K 7/20145; H05K 7/20181; H05K 7/202; H05K 7/20554; H05K 7/20563; H05K 7/20572; H05K 7/20618; H05K 7/20754
USPC ............... 361/679.46, 679.47, 679.5, 679.51, 361/690, 694, 695, 697; 312/223.2, 236; 454/184
See application file for complete search history.

(56) References Cited

U.S. PATENT DOCUMENTS

| | | | | |
|---|---|---|---|---|
| 5,559,674 | A * | 9/1996 | Katsui ..................... | H01L 23/40 165/121 |
| 6,104,608 | A * | 8/2000 | Casinelli ................. | F24F 13/24 181/224 |
| 2003/0156385 | A1* | 8/2003 | Askeland ............... | G06F 1/182 361/679.51 |
| 2003/0169567 | A1* | 9/2003 | Tantoush ................. | G06F 1/20 361/695 |
| 2004/0095723 | A1* | 5/2004 | Tsai ........................ | G06F 1/181 361/695 |
| 2006/0092612 | A1* | 5/2006 | Inoue ...................... | G06F 1/203 361/700 |
| 2007/0097630 | A1* | 5/2007 | Lee ..................... | H01L 23/4006 361/695 |
| 2008/0180905 | A1* | 7/2008 | Peng ........................ | G06F 1/20 361/679.48 |
| 2010/0002390 | A1* | 1/2010 | Jiang ........................ | G06F 1/20 361/697 |

* cited by examiner

*Primary Examiner* — Adam B Dravininkas
(74) *Attorney, Agent, or Firm* — Novick, Kim & Lee, PLLC; Jae Youn Kim

(57) ABSTRACT

An air guide unit is disclosed, which is adapted to be disposed between the back of a motherboard and a chassis. The motherboard and the chassis are joined by at least a first locking unit and a second locking unit. The air guide unit comprises an annular side wall. The annular side wall comprises: a first engagement portion adapted to engage with the first locking unit; and a second engagement portion adapted to engage with the second locking unit, wherein the engagement of the first engagement portion with the first locking unit and the engagement of the second engagement portion with the second locking unit limit the movement of the air guide unit in a first direction and a second direction. The second direction is perpendicular to the first direction.

16 Claims, 5 Drawing Sheets

AIR GUIDE UNIT

This application claims priority to Chinese Patent Application No. 201310025256.3 filed on Jan. 23, 2013.

BACKGROUND OF THE INVENTION

The present invention relates generally to the technical field of computer accessories, and more particularly, to an air guide unit disposed on the back of a motherboard to dissipate heat.

To cater to the trend of and the need for a high component density, a motherboard must be designed to make full use of the space thereof, and electronic components are installed on the back of the motherboard. The electronic components installed on the back of the motherboard generate heat during operation, but the space between the back of the motherboard and the chassis supporting the motherboard is usually limited. Therefore, how to make full use of the space to sufficiently dissipate heat from the electronic components installed on the back of the motherboard has become an important problem to be solved.

Accordingly, a need exists in the art to provide an air guide unit that is disposed between the back of a motherboard and a chassis for sufficiently dissipating heat and that is simple to install.

SUMMARY OF THE INVENTION

An embodiment of the present invention can provide an air guide unit, which is configured to be disposed between the back of a motherboard and a chassis. The motherboard and the chassis are joined by at least a first locking unit and a second locking unit. The air guide unit comprises an annular side wall. The annular side wall comprises a first engagement portion configured to engage with the first locking unit and a second engagement portion configured to engage with the second locking unit, wherein the engagement of the first engagement portion with the first locking unit and the engagement of the second engagement portion with the second locking unit limit the movement of the air guide unit in a first direction and a second direction, and the second direction is perpendicular to the first direction.

Other objectives, advantages and novel features of the present invention can be known by reviewing the following descriptions of embodiments with reference to the attached drawings.

BRIEF DESCRIPTION OF THE DRAWINGS

The abstract of the present invention and the detailed description of preferred embodiments can be better understood with reference to the attached drawings. However, it shall be appreciated that, the present invention is not limited to the accurate arrangements and apparatuses depicted. Furthermore, it shall be appreciated that, elements shown in the attached drawings are not necessarily depicted to scale for simplicity and clarity of description. For example, for purpose of clarity, dimensions of some elements may be magnified as compared to other elements. In the attached drawings.

DESCRIPTION OF THE PREFERRED EMBODIMENT

Figure 1:
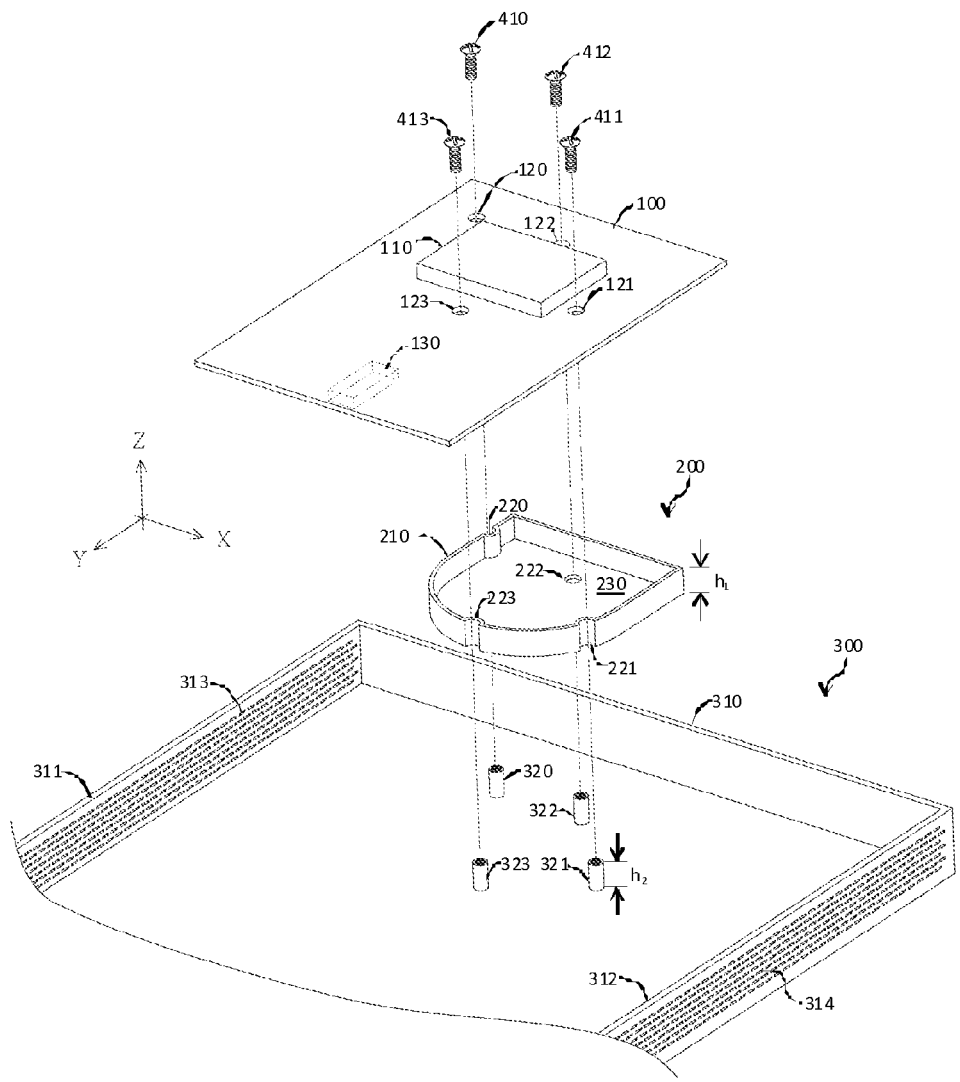
FIG. 1 is a perspective exploded view of a computer main body having an air guide unit, a chassis and a motherboard according to an embodiment of the present invention.

The embodiments of the present invention will be described in detail with reference to the attached drawings. Identical or similar components will be represented by identical reference numerals throughout the attached drawings as much as possible.

Figure 2:
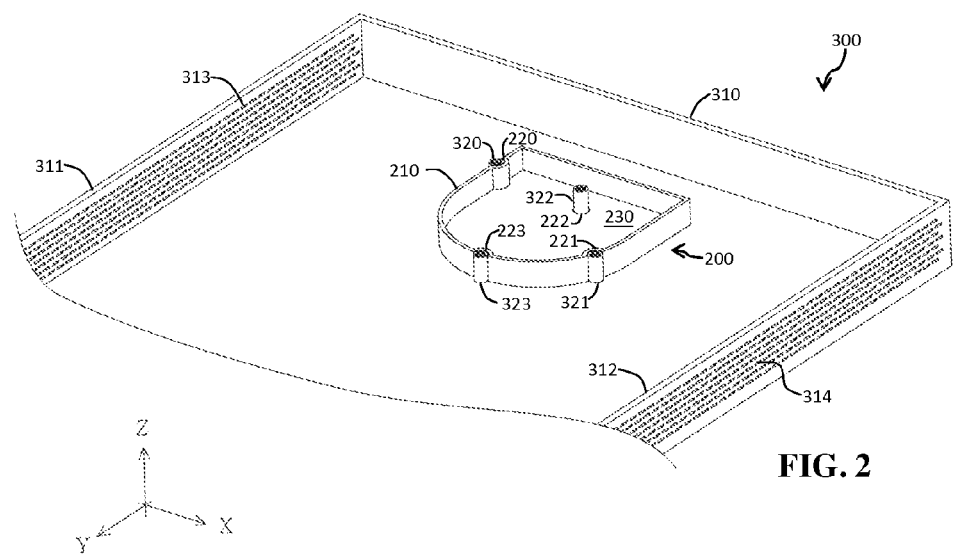
FIG. 2 is a perspective assembly view of an air guide unit and a chassis according to an embodiment of the present invention.
Figure 3:
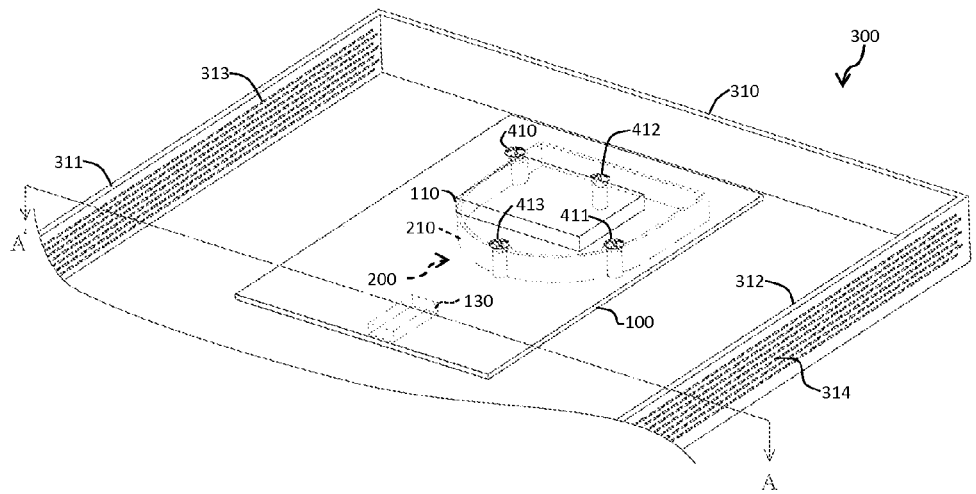
FIG. 3 is an assembly view of a computer main body having an air guide unit, a chassis and a motherboard according to an embodiment of the present invention.
Figure 4:
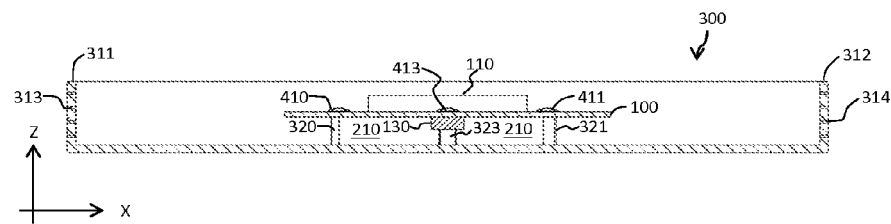
FIG. 4 is a cross sectional view of the computer main body of FIG. 3 that is taken along a line A-A'.

FIG. 1 is a perspective exploded view of a computer main body having an air guide unit 200 according to an embodiment of the present invention. FIG. 2 is a perspective assembly view of an air guide unit 200 and a chassis 300 according to an embodiment of the present invention. FIG. 3 is an assembly view of a computer main body having an air guide unit 200, a chassis 300 and a motherboard 100 according to an embodiment of the present invention. FIG. 4 is a cross sectional view of the computer main body of FIG. 3 that is taken along a line A-A'.

Referring to FIG. 1, an electronic component 110 is disposed on the front of a motherboard 100, and an electronic component 130 is also disposed on the back of the motherboard 100. The motherboard 100 comprises a plurality of locking holes 120, 121, 122, 123 for locking with a chassis 300.

The chassis 300 may comprise a plurality of side walls 310, 311, 312, where two of the opposite side walls 311, 312 may comprise vents 313, 314. The chassis 300 may have a plurality of locking units 320, 321, 322, 323 which correspond to the locking holes 120, 121, 122, 123 of the motherboard 100 disposed thereon. The locking units 320, 321, 322, 323 on the chassis 300 may each be a column, and the column may be hollow and may have a threaded inner wall. Screws 410, 411, 412, 413 may be inserted through the locking holes 120, 121, 122, 123 of the motherboard 100 to lock the motherboard 100 and the chassis 300 together through the locking units 320, 321, 322, 323. Those skilled in the art can appreciate that, the structures of commonly used locking units are not limited to those described above.

The air guide unit 200 of the present invention may be disposed between the back of the motherboard 100 and the chassis 300. The air guide unit 200 may comprise an annular side wall 210, and the shape of the annular side wall 210 may vary with the distribution of the electronic component 130 disposed on the back of the motherboard 100 and the distribution of the locking units 320, 321, 322, 323. The annular side wall 210 of the air guide unit 200 of the present invention may comprise at least two engagement portions for limiting the movement of the air guide unit 200 in an X direction and a Y direction. For example, the annular side wall 210 may comprise two engagement portions located at opposite corners, or two engagement portions located at two opposite edges of the annular side wall. The annular side wall 210 may further comprise other engagement portions to further limit the movement of the air guide unit 200 in the X direction and the Y direction or to avoid the locking units disposed on the chassis 300.

Referring to FIG. 1 and FIG. 2, according to an embodiment of the present invention, the annular side wall 210 may comprise a first engagement portion 220 and a second engagement portion 221. The first engagement portion 220 and the second engagement portion 221 each comprise a concave portion configured to engage with the locking unit 320 and the locking unit 321 respectively. The engagement of the first engagement portion 220 with the locking unit 320 and the engagement of the second engagement portion 221 with the locking unit 321 can limit the movement of the air guide unit 200 in the X direction and the Y direction. The annular side wall 210 further comprises another engagement portion 223 configured to engage with the locking unit 323 to further limit the movement of the air guide unit 200 in the X direction and the Y direction.

A length $h_1$ of the annular side wall 210 in a Z direction may be the same as the length $h_2$ of the locking units 320, 321, 322, 323 in the Z direction. Therefore, referring to FIG. 3 and FIG. 4, when the motherboard 100 and the chassis 300 are locked, the movement of the air guide unit 200 in the Z direction is limited by the motherboard 100 and the chassis 300.

According to the present invention, the movement of the air guide unit 200 in the X direction and the Y direction is limited by the engagement of the at least two engagement portions 220, 221 of the annular side wall 210 of the air guide unit 200 with the at least two locking units 320, 321, and the movement of the air guide unit 200 in the Z direction is limited by the motherboard 100 and the chassis 300. Therefore, the air guide unit 200 according to the present invention eliminates the need of additionally providing a fixing structure to fix the air guide unit 200 in position, thereby saving the space and reducing the cost.

The air guide unit 200 may further comprise a bottom portion 230, which is located in the X-Y plane and is connected with an end of the annular side wall 210. The bottom portion 230 may comprise a through hole 222, which allows a locking unit 322 used for joining the motherboard 100 and the chassis 300 be inserted therethrough.

Figure 5:
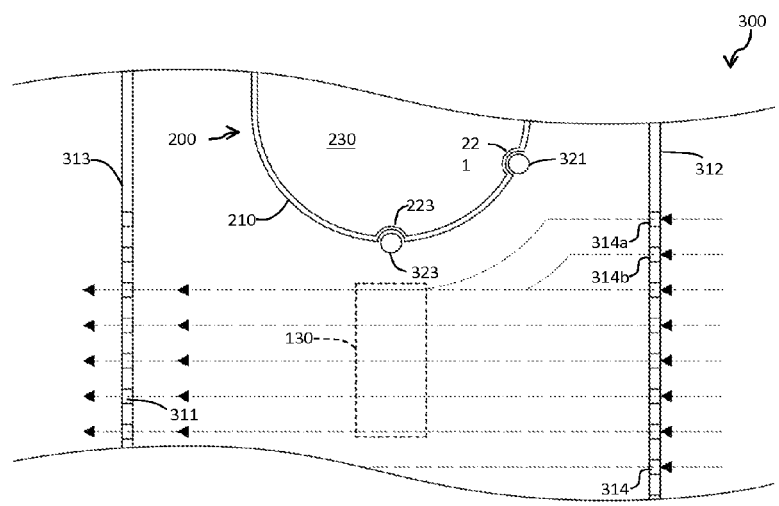
FIG. 5 is a schematic view illustrating heat dissipating paths and heat dissipating method of the air guide unit of the present invention.

FIG. 5 illustrates heat dissipating path and heat dissipating method of the air guide unit 200 of the present invention. Referring to FIG. 3 and FIG. 5, the electronic component 130 is disposed at a front end on the back of the motherboard 100, the vents 314 in a side wall 312 of the chassis 300 may be an air inlet of the computer main body, and the vents 313 in another side wall 311 may be an air outlet of the computer main body. Therefore, the air guide unit 200 can be disposed at a back end on the back of the motherboard 100, and a side of the annular side wall 210 of the air guide unit 200 that faces the electronic component 130 can have a shape capable of guiding the air (as shown by arrows) from the air inlet to the electronic component 130 and then through the electronic component 130 to the air outlet, thereby dissipating heat from the electronic component 130. For example, as shown in FIG. 5, the air entering into the computer main body from the vents 314a, 314b adjacent to the air guide unit 200 is guided by the air guide unit 200 to the electronic component 130 to achieve the heat dissipation effect.

According to the present invention, the structure, the shape and the location of the air guide unit may vary with the distribution of the electronic component on the back of the motherboard and the distribution of the locking units. For example, the air guide path of the system is designed according to the distribution of the electronic component on the back of the motherboard and locations of the air inlet and the air outlet, the shape of the annular side wall is configured mainly based on the air guide path, and the locking units on or close to the air guide path are optionally used to engage with the annular side wall. The number of the locking units used to lock the motherboard 100 and the chassis 300 may be twenty, but the number of the locking units on the air guide path that can be used as locking points of the annular side wall may be only two or three.

Figure 6:
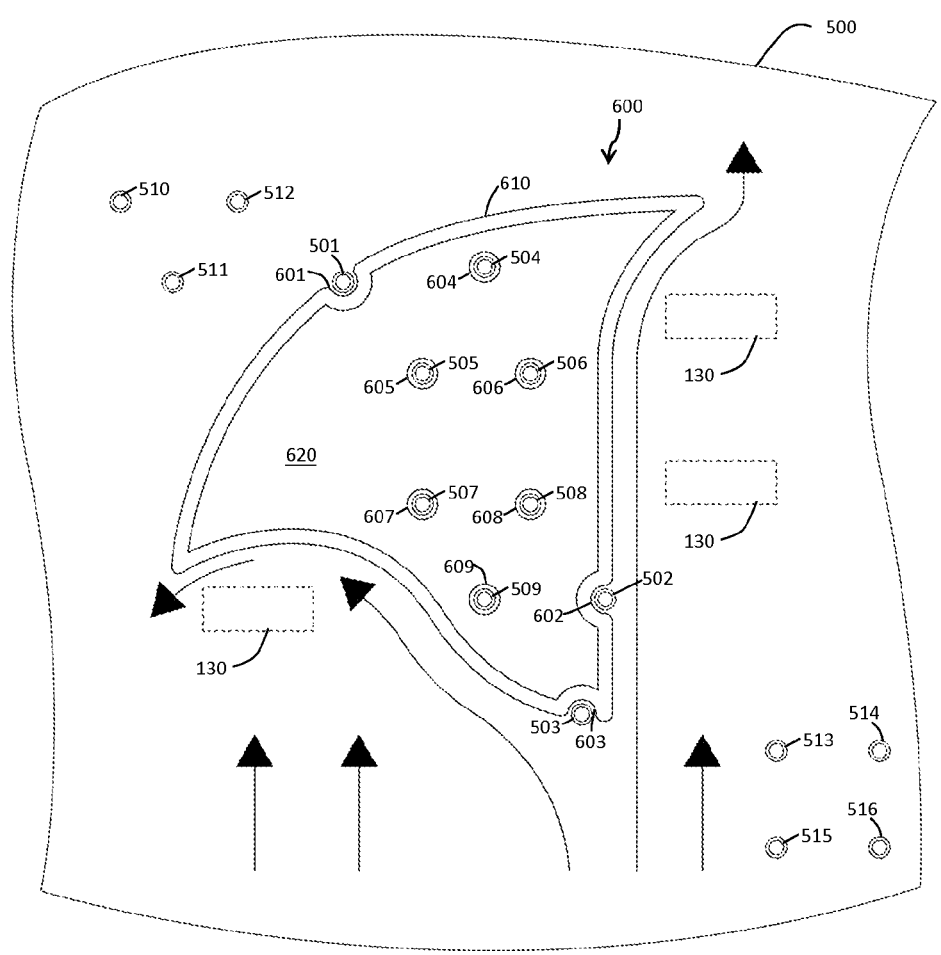
FIG. 6 is a schematic view illustrating variations of the air guide unit of the present invention that are made according to different heat dissipating paths and locking locations.
Figure 7:
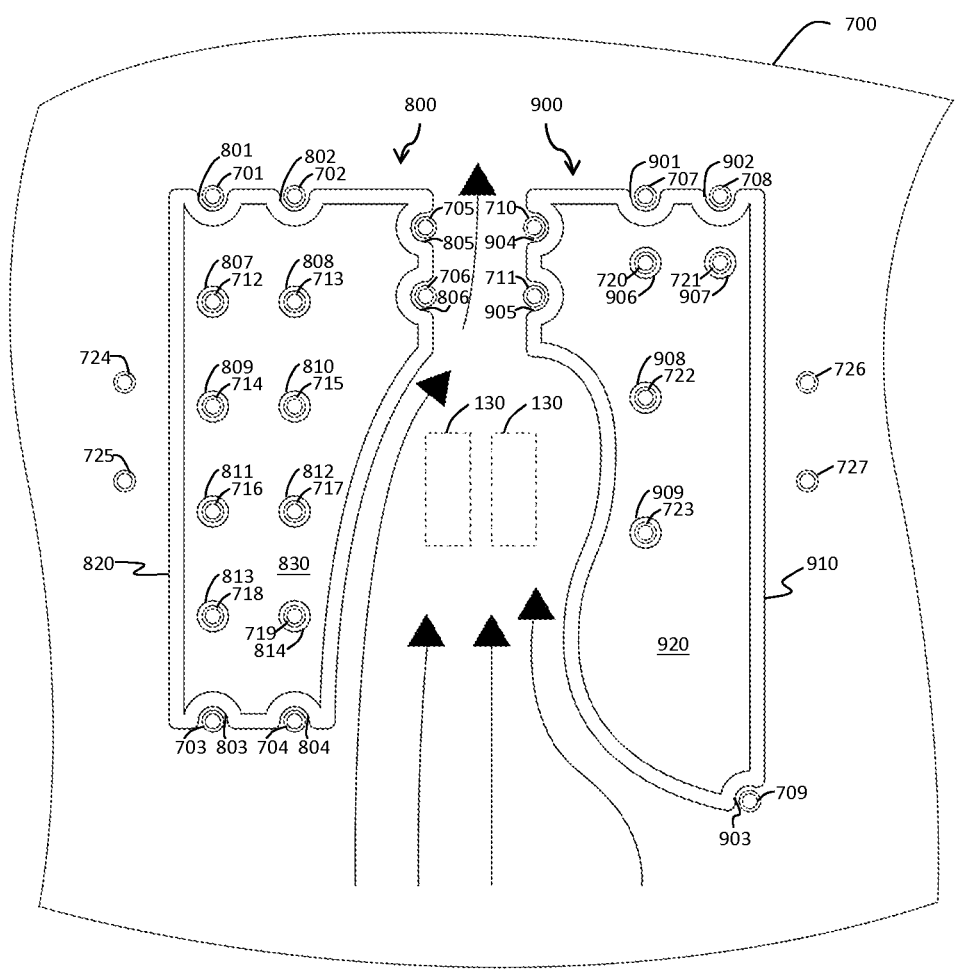
FIG. 7 is a schematic view illustrating variations of the air guide unit of the present invention that are made according to different heat dissipating paths and locking locations.

FIG. 6 and FIG. 7 are schematic views illustrating variations of the air guide unit of the present invention that are made based on different heat dissipating paths and locking locations.

Referring to FIG. 6, a chassis 500 comprises a plurality of locking units 501~516 for locking with a motherboard. Three electronic components 130 are disposed on the back of the motherboard. An air inlet and an air outlet of the computer main body are located at a lower portion and an upper portion of FIG. 6 respectively, so the air is blown upwards from the lower portion as shown by arrows of FIG. 6. In order to guide the air from the air inlet to the electronic components 130 and then to the air outlet and also in order to use some of the locking units 501~516 on the chassis 500 as locking points of an air guide unit, a side wall 610 of the air guide unit 600 may have a shape as shown in FIG. 6. The side wall 610 of the air guide unit 600 may comprise three engagement portions 601, 602, 603, which are configured to engage with the locking units 501, 502, 503 respectively. In addition, a bottom portion 620 of the air guide unit 600 may comprise a plurality of through holes 604, 605, 606, 607, 608, 609 configured to avoid the locking units 504, 505, 506, 507, 508, 509.

According to another embodiment of the present invention, referring to FIG. 7, a chassis 700 comprises a plurality of locking units 701~727 for locking with a motherboard. Two electronic components 130 are disposed on the back of the motherboard. An air inlet and an air outlet of the computer main body are located at a lower portion and an upper portion of FIG. 7 respectively, so the air is blown upwards from the lower portion as shown by arrows of FIG. 7. In order to guide the air from the air inlet to the electronic components 130 and then to the air outlet and also in order to use some of the locking units 701~727 on the chassis 700 as locking points of an air guide unit, two air guide units 800, 900 may be disposed on the chassis 700.

Side walls 820, 910 of the air guide units 800, 900 may have shapes as shown in FIG. 7. The side wall 820 of the air guide unit 800 may comprise three engagement portions 801, 803, 806, which are configured to engage with the locking units 701, 703, 706 respectively to limit the movement of the air guide unit 800 in the horizontal direction. The side wall 820 of the air guide unit 800 may further comprise other engagement portions 802, 804, 805, which are configured to engage with the locking units 702, 704, 705 respectively to further limit the movement of the air guide unit 800 in the horizontal direction and avoid the locking units 702, 704, 705. A bottom portion 830 of the air guide unit 800 may comprise a plurality of through holes 807, 808, 809, 810, 811, 812, 813, 814 to avoid the locking units 712, 713, 714, 715, 716, 717, 718, 719.

Similar to the air guide unit 800, the side wall 910 of the air guide unit 900 may comprise three engagement portions 902, 903, 905, which are configured to engage with the locking units 708, 709, 711 respectively to limit the movement of the air guide unit 900 in the horizontal direction. The side wall 910 of the air guide unit 900 may further comprise other engagement portions 901, 904, which are configured to engage with the locking units 707, 710 respectively to further limit the movement of the air guide unit 900 in the horizontal direction and avoid the locking units 707, 710. A bottom portion 920 of the air guide unit 900 may comprise a plurality of through holes 906, 907, 908, 909 to avoid the locking units 720, 721, 722, 723.

According to the above descriptions, the person skilled in the art can appreciate that, the structure, the shape and the location of the air guide unit of the present invention may vary with the distribution of the electronic component(s) on the back of the motherboard, the distribution of the locking units, and locations of the air outlet and the air inlet.

As will be appreciated by those skilled in the art, modifications may be made to these embodiments without departing from the general concepts of the present invention. Therefore, the present invention is not limited to the embodiments disclosed herein, but shall also cover all modifications made within the spirits and scope as claimed in the appended claims.

What is claimed is:

1. An air guide unit configured for being disposed between the back of a motherboard and a chassis, the motherboard and the chassis being joined by at least a first locking unit and a second locking unit, the air guide unit comprising:
   an annular side wall, which comprises:
   a first engagement portion configured to engage with the first locking unit; and
   a second engagement portion configured to engage with the second locking unit,
   wherein the engagement of the first engagement portion with the first locking unit and the engagement of the second engagement portion with the second locking unit limit the movement of the air guide unit in a first direction and a second direction, and the second direction is perpendicular to the first direction, and
   wherein a length of the annular side wall in a third direction is the same as the length of the first locking unit in the third direction so that the movement of the air guide unit in the third direction is limited by the motherboard and the chassis, and the third direction is perpendicular to both the first direction and the second direction.

2. The air guide unit of claim 1, wherein the first engagement portion and the second engagement portion are each located at one of two opposite corners of the annular side wall respectively.

3. The air guide unit of claim 1, wherein the first engagement portion and the second engagement portion are each located at one of two opposite edges of the annular side wall respectively.

4. The air guide unit of claim 1, wherein the first engagement portion and the second engagement portion each comprise a concave portion configured to engage with the first locking unit and the second locking unit respectively.

5. The air guide unit of claim 1, the air guide unit further comprising a bottom portion, wherein the bottom portion is located in a plane parallel to the first direction and the second direction and connects with an end of the annular side wall.

6. The air guide unit of claim 5, wherein the bottom portion comprises at least one through hole, and each of the at least one through hole allows a locking unit for joining the motherboard and the chassis be inserted therethrough.

7. The air guide unit of claim 1, wherein a shape of the annular side wall is configured based on a location(s) of at least one electronic component on the back of the motherboard, locations of the locking units and locations of an air inlet and an air outlet of the chassis so as to guide the air from the air inlet to the at least one electronic component and then from the at least one electronic component to the air outlet.

8. An electronic device comprising:
   a motherboard;
   a chassis;
   an air guide unit disposed between the back of, the motherboard and the chassis; and
   a first locking unit and a second locking unit for joining the motherboard and the chassis,
   wherein the air guide unit comprises an annular side wall, which comprises
   a first engagement portion configured to engage with the first locking unit; and
   a second engagement portion configured to engage with the second locking unit,
   wherein the engagement of the first engagement portion with the first locking unit and the engagement of the second engagement portion with the second locking unit limit the movement of the air guide unit in a first direction and a second direction, and the second direction is perpendicular to the first direction, and
   wherein a length of the annular side wall in a third direction is the same as the length of the first locking unit in the third direction so that the movement of the air guide unit in the third direction is limited by the motherboard and the chassis, and the third direction is perpendicular to both the first direction and the second direction.

9. The electronic device of claim 8, wherein the first engagement portion and the second engagement portion are each located at one of two opposite corners of the annular side wall respectively.

10. The electronic device of claim 8, wherein the first engagement portion and the second engagement portion are each located at one of two opposite edges of the annular side wall respectively.

11. The electronic device of claim 8, wherein the first engagement portion and the second engagement portion each comprise a concave portion configured to engage with the first locking unit and the second locking unit respectively.

12. The electronic device of claim 8, the air guide unit further comprising a bottom portion, wherein the bottom portion is located in a plane parallel to the first direction and the second direction and connects with an end of the annular side wall.

13. The electronic device of claim 12, wherein the bottom portion comprises at least one through hole, and each of the at least one through hole allows a locking unit for joining the motherboard and the chassis be inserted therethrough.

14. The electronic device of claim 8, wherein a shape of the annular side wall is configured based on a location(s) of at least one electronic component on the back of the motherboard, locations of the locking units and locations of an air inlet and an air outlet of the chassis so as to guide the air from the air inlet to the at least one electronic component and then from the at least one electronic component to the air outlet.

15. The electronic device of claim 8, wherein the first locking unit and the second locking unit each comprises a hollow column having a threaded inner wall.

16. The electronic device of claim 15, further comprising a first screw and a second screw for locking the motherboard to the chassis via the first locking unit and the second locking unit, respectively.

* * * * *